United States Patent [19]

Sterner et al.

[11] 3,723,905

[45] Mar. 27, 1973

[54] DUAL-GATE MOS-FET OSCILLATOR CIRCUIT WITH AMPLITUDE STABILIZATION

[75] Inventors: John Franklin Sterner, Piscataway; George Draper Hanchett, Summit, both of N.J.

[73] Assignee: RCA Corporation

[22] Filed: June 21, 1971

[21] Appl. No.: 154,825

[52] U.S. Cl. ................ 331/109, 331/117 R, 331/183
[51] Int. Cl. ............................ H03b 3/02, H03b 5/12
[58] Field of Search ........... 331/109, 183, 117 R, 171

[56] References Cited

UNITED STATES PATENTS

| | | | |
|---|---|---|---|
| 2,919,413 | 12/1959 | Charles | 331/183 X |
| 3,624,541 | 11/1971 | Lundstrom | 331/109 X |

*Primary Examiner*—Roy Lake
*Assistant Examiner*—Siegfried H. Grimm
*Attorney*—Edward J. Norton

[57] ABSTRACT

An oscillator circuit includes a dual-gate MOS field-effect transistor arranged in a Hartley oscillator configuration and operated in a manner to maintain the oscillator signal output level substantially constant over a wide frequency range.

3 Claims, 1 Drawing Figure

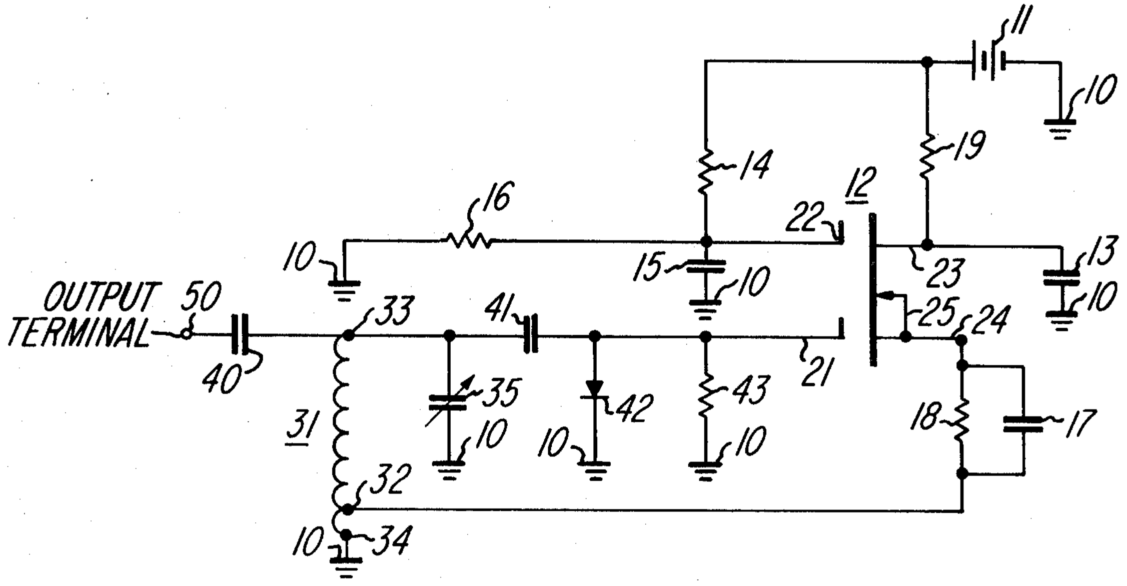
INVENTOR.
John F. Sterner &
George D. Hanchett
BY Edward J. Norton
ATTORNEY

DUAL-GATE MOS-FET OSCILLATOR CIRCUIT WITH AMPLITUDE STABILIZATION

BACKGROUND OF THE INVENTION

This invention relates to oscillator circuitry, and particularly to semiconductor device circuitry for oscillator applications such as variable frequency signal generators.

Present day transistor oscillator circuits show relatively high output amplitude variations as a function of operating frequency or output loading particularly in continuously tunable circuits. Further, the output level at a particular frequency will typically change substantially after a component or active device such as a semiconductor is replaced by another ostensibly of the same type. To eliminate these amplitude variations, output sensing devices are normally employed in circuit stages after the oscillator stage. A portion of the output from one of these latter stages is fed back to the oscillator to compensate for level differences. The dynamic range of these circuits is typically so limited that distortion of the output signal results when the need for compensation is pronounced.

SUMMARY OF THE INVENTION

In the present invention, an oscillator includes an amplifying element having a current conducting path between first and second terminals, the conductivity of the element being controlled by first and second control electrodes with each of the control electrodes being disposed to provide control of the path independent of the other control electrode. A voltage source having a pair of terminals is coupled between the element terminals. A feedback path is completed from one of the element terminals to one of the control electrodes to operate the element in an oscillator circuit. A time constant circuit is connected in the feedback path to provide to the one control electrode a bias whose average value varies according to changes in the magnitude of signals appearing over the feedback path in a direction to reduce such changes. The means coupling the one element terminal in the feedback path to a terminal of the voltage source includes further means to derive a second bias having a value determined according to changes in the level of current conductivity of the element which effectively alters the feedback signals in a direction to cancel the changes in the level of current conductivity of the element. A third bias is applied to the second control electrode to cause the control exercised on the conducting path by the second control electrode to be determined by the level of conductivity of the element in response to the feedback signal and the first bias applied to the first control electrode so that the gain of the element is increased over that obtained in the absence of the second control electrode and its third bias.

DESCRIPTION OF THE PREFERRED EMBODIMENT

Referring to the single FIGURE of the accompanying drawing which illustrates one embodiment of the invention, a dual-gate MOS field-effect (FET) semiconductor device 12 is shown. The negative terminal of DC voltage source 11 is connected to a point of reference potential 10. The positive terminal of DC voltage source 11 is connected to the junction formed by one terminal of a resistor 19 and one terminal of a resistor 14. The other terminal of resistor 19 is connected to the junction formed by the drain electrode 23 of semiconductor device 12 and one terminal of by-pass capacitor 13. The other terminal of capacitor 13 is connected to the point of reference potential 10. The remaining terminal of resistor 14 is connected to the junction formed by the gate electrode 22 of semiconductor device 12, one terminal of resistor 16 and one terminal of by-pass capacitor 15. The other terminal of capacitor 15 and the remaining terminal of resistor 16 are connected to the point of reference potential 10. The substrate electrode 25 of semiconductor device 12 is internally connected to the source electrode 24.

The source electrode 24 of semiconductor device 12 is connected to the junction formed by one terminal of resistor 18 and one terminal of by-pass capacitor 17. The other terminal of resistor 18 and the other terminal of capacitor 17 are connected to a tap point 32 along inductor 31. Terminal 34 of inductor 31 is connected to the point of reference potential 10.

The other gate electrode 21 of semiconductor device 12 is connected to the junction formed by the anode of diode 42, one terminal of coupling capacitor 41 and one terminal of gate-leak resistor 43. The other terminal of resistor 43 and the cathode terminal of diode 42 are connected to the point of reference potential 10. The other terminal of capacitor 41 is connected to the junction formed by one terminal of variable capacitor 35, the terminal 33 of inductor 31 and one terminal of output capacitor 40. The other terminal of capacitor 35 is connected to the point of reference potential 10. The other terminal of output capacitor 40 is connected to output terminal 50.

The oscillator circuit shown in the drawing includes a n-channel, depletion type dual-gate MOS field-effect transistor. While a dual-gate MOS-FET is shown as the preferred device, other semiconductor devices, including a cascode arrangement of two or more bipolar transistors, can be used in an application of the principles of this invention. The necessary bias conditions for the oscillator circuit are provided by: (i) a self-bias applied to the gate 21 by the rectifying network including capacitor 41, diode 42, and resistor 43; (ii) a self-bias voltage developed across source resistor 18 and applied to the source 24; and (iii) a fixed voltage applied to gate 22 by the resistive divider network, resistors 14 and 16.

The oscillating frequency of the circuit as described is determined by the following relationship $$\omega_o^2 = 1/LC$$

where L and C, respectively, define the electrical values of the inductor 31 and the capacitor 35 in the tank circuit. Oscillations start when the noise voltages, present in the tank circuit at the resonant frequency, are applied to gate 21 and amplified by device 12. A return path to ground for the amplified signal is provided by inductor 31, through tap-point 32 and terminal 34. Inductor 31 also functions as an autotransformer to apply an in-phase amplified signal to the tank circuit. The amplified signal is coupled into the tank circuit from the induced voltage in inductor 31 between terminal 33 and tap point 32. Regenerative feedback is obtained from the tank circuit and applied to gate 21 of device 12. Once oscillations are initiated by the feedback signal they rapidly increase in amplitude until an equilibrium condition is established.

The output of the oscillator is obtained from the tank circuit. The filtering effect of the tuned circuit provides a sinusoidal waveform at the resonant frequency controlled by the frequency-determining elements.

Since the feedback signal is also obtained from the tank circuit it will likewise exhibit a sinusoidal waveform. During the positive portions of the feedback voltage applied to gate 21, the diode 42 conducts thereby charging capacitor 41. During the negative portions of the feedback voltage, diode 42 is back-biased and capacitor 41 discharges through the resistor 43. The value of discharge resistor 43 is selected to provide a long discharge time constant relative to the charging time constant of capacitor 41 through diode 42. As a result, capacitor 41 accumulates a charge which appears negative at gate 21. The resulting D.C. voltage provides a negative bias voltage in series with the feedback voltage.

Thus, if the feedback voltage increases the negative bias increases; this reduces the amplification of device 12 by causing both the transconductance, gm, and the angle of drain current flow to become less. Conversely, if the feedback voltage decreases the amplification of device 12 will increase. This is because any tendancy to change the feedback voltage produces a large effect on the drain current which tends to change the bias at gate 21 in such a way as to maintain the feedback voltage nearly constant. And since the oscillator output voltage is derived from the feedback voltage, it will tend to remain constant.

However, since the charging and discharging time constants of the foregoing rectifying circuit are fixed, the resulting negative bias can vary as a function of frequency-i.e. as the operating frequency increases the rectified D.C. voltage can increase. Further, as the loading presented to the tank circuit, at the output terminal 50, is increased, more energy is diverted into the load and less energy is available to charge capacitor 41. With less charge on capacitor 41 the conductive time of device 12 will increase, since it will be forward biased for a greater portion of the positive portion of the sinusoidal feedback voltage. Under these conditions, the output voltage could vary as a function of frequency and loading. Hence, in order to maintain the voltage output level substantially constant over a wide frequency range these effects must be cancelled. The voltage developed across resistor 18 provides this function as described below.

The average current flowing through device 12 develops a D.C. voltage across source resistor 18. If the current flow through the conducting path between the drain and the source increases, the voltage level developed across resistor 18 will increase and thereby effectively bias gate 21 in a more negative, or less conducting direction. Similarly a decrease in the current flow will result in a more positive, or more conducting, bias at gate 21 of device 12. This effect tends to cancel voltage output level variations that would otherwise result.

The effectiveness of the foregoing combined methods for achieving a constant voltage output level is realized when feedback signals presented to gate 21 have a large effect on the drain current. That is, the transconductance or gain of device 12 must be sufficiently high to permit a small change in input signal to result in a large change in drain current. Further, device 12 must remain in a substantially linear or active operating region throughout the range of feedback voltage excursions in order to remain responsive to input signal changes. A further requirement is that the device must be biased to operate in the prescribed manner without diminishing the controlling effect of the previously described bias conditions.

In accordance with the present invention, a dual gate MOS-FET semiconductor device fulfills these requirements. The device, as illustrated in the preferred embodiment, can be considered a combination of two single-gate devices in a cascode configuration. The drain voltage of the single-gate device associated with gate 21 is actually the source voltage of the other single-gate device. If a constant bias voltage is applied to gate 22, the conductivity of the single-gate device associated with the gate will be controlled by its source voltage. Thus if a sinusoidal voltage signal is applied to gate 21 it will be amplified by the gain of the single-gate device associated with that gate and appear at its drain. The positive going half-cycle of the sinusoidal waveform will appear as a negative going half-cycle at the source of the single-gate device associated with gate 22. Since the gate 22 is biased at a constant positive potential the negative going signal will be amplified by the gain of the single-gate device associated with this gate. Hence the voltage presented to gate 21 will be amplified by the combined gain of the cascode configuration.

The cascode combination provides optimum transconductance for gain and dynamic range without diminishing the controlling effect of the previously described bias conditions. In addition the cascode combination provides increased isolation between the feedback signal and the voltage source 11. The resulting decrease in capacitance to ground, through the voltage source, provides increased bandwidth and a more constant voltage output level.

In the present embodiment, gate 22 is biased to the described optimum transconductance point by the resistive divider network, resistors 14 and 16. Thus, if a variation in the feedback voltage is caused by a change in such parameters as operating frequency, output load impedance, device characteristics or supply voltage the variations will be amplified by the gain of the cascode configuration. The combined gain of device 12 will (i) present an amplified voltage to the rectifying network coupled to gate 21; and (ii) develop an amplified voltage across the source resistor coupled to source 24. In the arrangement described above, the effect of this voltage is to oppose the variations presented to the gate 21. By combining the biasing techniques herein described and optimizing their cooperative effects, overall voltage output stability and low distortion not heretofore obtainable results.

What is claimed is:

1. An oscillator comprising, a dual-gate MOS field-effect transistor having a drain, source and two gate electrodes, means to couple a voltage source having a pair of terminals between said drain and source electrodes to provide a current conductive path controlled by said gate electrodes, a feedback path completed from said source electrode to one of said gate electrodes to operate said transistor in an oscillator circuit, a rectifying network time constant circuit connected in said feedback path to provide to said one gate electrode a unidirectional bias whose average value varies according to changes in the magnitude of signals appearing over said feedback path in a direction to reduce said changes, said means to couple said source electrode to a terminal of said voltage source including a resistor across which a second bias voltage is derived having a value determined according to changes in the level of current conductivity of said transistor which effectively alters said feedback signals in a direction to cancel said changes in the level of current conductivity of said transistor, means to apply a third bias to said second gate electrode to cause the control exercised on said conducting path by said second gate electrode to be determined by the level of conductivity of said transistor in response to said feedback signal and said first bias applied to said first gate electrode so that the gain of said transistor is increased over that obtained in the absence of said second gate electrode and the application of said third bias thereof.

2. An oscillator as claimed in claim 1 and wherein said last mentioned means includes a resistive divider connected between the terminals of said voltage source to apply a fixed bias to said second gate electrode.

3. A field-effect transistor oscillator, including amplitude stabilization means, comprising:

a MOS field-effect transistor having a drain, a source and first and second control gate electrodes;

means for coupling a voltage source having a pair of terminals between said drain and source electrodes to provide a current conductive path controlled by said gate electrodes;

a feedback path including a tank circuit for applying feedback signals from said source electrode to said first gate electrode to operate said transistor in an oscillator circuit, said tank circuit having an adjustable reactance means whose value determines the frequency of oscillation of said oscillator circuit over a predetermined range of frequencies;

a rectifying network time constant circuit connected in said feedback path to provide to said first gate electrode a unidirectional bias whose average value varies according to changes in the magnitude of signals appearing over said feedback path in a direction to reduce said changes;

said means for coupling said source electrode to a terminal of said voltage source including a resistor across which a second bias voltage is derived whose value changes according to changes in the level of current conductivity of said transistor to effectively alter said feedback signals in a direction to oppose said changes in the level of current conductivity of said transistor; and means including a resistive divider connected between the terminals of said voltage source to apply a fixed bias to said second gate electrode, said last mentioned means including a capacitive impedance coupled between said second gate electrode and a terminal of said voltage source, whereby the control exercised on said conductive path by said second gate electrode is determined by the level of conductivity of said transistor.

* * * * *